United States Patent
Kim et al.

(10) Patent No.: US 10,366,799 B2
(45) Date of Patent: Jul. 30, 2019

(54) TRANSPARENT CONDUCTOR, METHOD FOR PREPARING THE SAME AND DISPLAY APPARATUS INCLUDING THE SAME

(71) Applicant: SAMSUNG SDI CO., LTD., Yongin-si, Gyeonggi-do (KR)

(72) Inventors: Do Young Kim, Suwon-si (KR); Kyoung Ku Kang, Suwon-si (KR); Dong Myeong Shin, Suwon-si (KR); Dae Seob Shim, Suwon-si (KR); Young Hoon Kim, Suwon-si (KR); Ji Hyeon Yim, Suwon-si (KR); Yong Un Jung, Suwon-si (KR); Oh Hyeon Hwang, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 149 days.

(21) Appl. No.: 15/353,761

(22) Filed: Nov. 17, 2016

(65) Prior Publication Data

US 2017/0154698 A1    Jun. 1, 2017

(30) Foreign Application Priority Data

Dec. 1, 2015 (KR) .......................... 10-2015-0170262

(51) Int. Cl.
*H01B 1/02* (2006.01)
*H01L 27/12* (2006.01)
*G02F 1/1343* (2006.01)
*G06F 3/044* (2006.01)

(52) U.S. Cl.
CPC ........... *H01B 1/02* (2013.01); *G02F 1/13439* (2013.01); *G06F 3/044* (2013.01); *H01L 27/124* (2013.01); *G06F 2203/04103* (2013.01); *G06F 2203/04112* (2013.01)

(58) Field of Classification Search
CPC . H01B 1/02; G06F 3/044; G06F 2203/04112; G06F 2203/04103; G02F 1/13439; H01L 27/124

USPC ................................................. 252/514, 512
See application file for complete search history.

(56) References Cited

U.S. PATENT DOCUMENTS

| 8,383,014 | B2 * | 2/2013 | Vanheusden | H01B 1/22 252/512 |
| 2011/0254034 | A1 * | 10/2011 | Konsek | B82Y 20/00 257/98 |
| 2015/0156866 | A1 * | 6/2015 | Shim | H05K 1/0274 361/751 |
| 2015/0206620 | A1 * | 7/2015 | Shin | H01B 1/22 428/457 |
| 2017/0200526 | A1 * | 7/2017 | Guo | H01B 1/02 |

FOREIGN PATENT DOCUMENTS

| KR | 10-0716201 B1 | 5/2007 |
| KR | 10-2012-0053724 A | 5/2012 |
| KR | 10-2015-0048042 A | 5/2015 |
| KR | 10-2015-0065597 A | 6/2015 |

OTHER PUBLICATIONS

Menamparambath, et al. "Silver Nanowires Decorated with Silver Nanoparticles for Low-Haze Flexible Transparent Conductive Films" Scientific Reports 5, 16371 (2015) pp. 1-9.
Lopez-Diaz, et al. "Modulating the Optoelectronic Properties of Silver Nanowires Films: Effect of Capping Agent and Deposition Technique," Materials, 2015, 8, 7622-7633.
Korean Office Action dated Jul. 25, 2017 in the corresponding Korean Patent Application No. 10-2015-0170262 claimed as priority.

* cited by examiner

*Primary Examiner* — Douglas J McGinty
(74) *Attorney, Agent, or Firm* — Lee & Morse, P.C.

(57) ABSTRACT

A transparent conductor, a method of manufacturing the same, and a display including the same, the transparent conductor including metal nanowires; and a matrix in which the metal nanowires are embedded, wherein a capping layer is formed on surfaces of the metal nanowires, the capping layer including a sulfur-containing compound, and the capping layer has a thickness of about 0.025 or less times an average diameter of the metal nanowires.

16 Claims, 4 Drawing Sheets

TRANSPARENT CONDUCTOR, METHOD FOR PREPARING THE SAME AND DISPLAY APPARATUS INCLUDING THE SAME

CROSS-REFERENCE TO RELATED APPLICATION

Korean Patent Application No. 10-2015-0170262, filed on Dec. 1, 2015, in the Korean Intellectual Property Office, and entitled: "Transparent Conductor, Method for Preparing the Same and Display Apparatus Comprising the Same," is incorporated by reference herein in its entirety.

SUMMARY

1. Field

Embodiments relate to a transparent conductor, a method of manufacturing the same, and a display apparatus including the same.

2. Description of the Related Art

A display including a touchscreen panel may include a transparent conductor. A metal nanowire-containing transparent conductor may include metal nanowires and a matrix.

SUMMARY

Embodiments are directed to a transparent conductor, a method of manufacturing the same, and a display apparatus including the same.

The embodiments may be realized by providing a transparent conductor including metal nanowires; and a matrix in which the metal nanowires are embedded, wherein a capping layer is formed on surfaces of the metal nanowires, the capping layer including a sulfur-containing compound, and the capping layer has a thickness of about 0.025 or less times an average diameter of the metal nanowires.

The capping layer may have a thickness of about 0.005 times to about 0.025 times the average diameter of the metal nanowires.

The transparent conductor may have a haze of about 1.1% or less, as measured in the visible range.

The transparent conductor may have a transmissive b* of about 1.1 or less, as measured at a wavelength of 400 nm to 700 nm.

The metal nanowires may be silver nanowires.

The capping layer may include polyvinylpyrrolidone, polyvinylalcohol, cetyltrimethylammonium bromide, cetyltrimethylammonium chloride, or polyacrylamide.

The sulfur-containing compound may include a thiol group-containing compound.

The thiol group-containing compound may include 2-aminoethanethiol, 1-propanethiol, 3-mercaptopropionic acid, (3-mercaptopropyl)trimethoxysilane, 1-butanethiol, 2-butanethiol, isobutylmercaptan, isoamylmercaptan, cyclopentanethiol, 1-hexanethiol, cyclohexanethiol, 6-hydroxy-1-hexanethiol, 6-amino-1-hexanethiol hydrochloric acid, 1-heptanethiol, 7-carboxy-1-heptanethiol, 7-amido-1-heptanethiol, 1-octanethiol, tert-octanethiol, 8-hydroxy-1-octanethiol, 8-amino-1-octanethiol hydrochloride, 1H,1H,2H,2H-perfluorooctanethiol, 1-nonanethiol, 1-decanethiol, 10-carboxy-1-decanethiol, 10-amido-1-decanethiol, 1-naphthalenethiol, 2-naphthalenethiol, 1-undecanethiol, 11-amino-1-undecanethiol hydrochloride, 11-hydroxy-1-undecanethiol, 1-dodecanethiol, 1-tetradecanethiol, 1-hexadecanethiol, 16-hydroxy-1-hexadecanethiol, 16-amino-1-hexadecanethiol hydrochloride, 1-octadecanethiol, 1,4-butanedithiol, 2,3-butanedithiol, 1,6-hexanedithiol, 1,2-benzenedithiol, 1,9-nonanedithiol, 1,10-decanedithiol, or 1,3,5-benzenetrithiol.

The metal nanowires may be silver nanowires, the capping layer may include polyvinylpyrrolidone, and the sulfur-containing compound may be a thiol group-containing compound.

The matrix may further include hollow silica.

The embodiments may be realized by providing a method of manufacturing a transparent conductor, the method including forming a metal nanowire dispersion layer on a base layer, the metal nanowire dispersion including metal nanowires with a capping layer formed on surfaces of the metal nanowires; coating a matrix composition onto the metal nanowire dispersion layer; and forming a conductive layer by curing the metal nanowire dispersion layer and the matrix composition, wherein the capping layer includes a sulfur-containing compound.

The metal nanowires with the capping layer formed on surfaces thereof may be prepared from a metal nanowire dispersion including the metal nanowires, a capping agent, the sulfur-containing compound, and an acid having a pKa of about 4.0 to about 5.0 at 25° C.

The acid may include acetic acid.

The embodiments may be realized by providing a display including the transparent conductor according to an embodiment.

The embodiments may be realized by providing a display including a transparent conductor manufactured by the method of manufacturing a transparent conductor according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
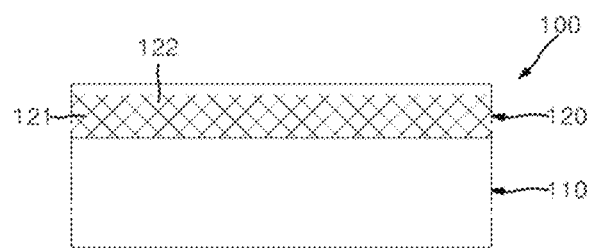
FIG. 1 illustrates a cross-sectional view of a transparent conductor according to one embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout. As used herein, the term "or" is not an exclusive term, e.g., A or B includes A, B, or A and B.

As used herein, spatially relative terms such as "upper" and "lower" are defined with reference to the accompanying drawings. Thus, it will be understood that the term "upper surface" can be used interchangeably with the term "lower surface". It will be understood that when an element such as a layer, film, region or substrate is referred to as being placed "above" or "on" another element, it can be directly placed on the other element, or intervening layer(s) may also be present. Conversely, when an element is referred to as being placed "directly above" or "directly on" another element, no intervening layer(s) are present.

As used herein, the term "aspect ratio" refers to a ratio of the maximum length L of a metal nanowire to an average diameter d of the metal nanowire (L/d) in a sectional view. In addition, the term "(meth)acrylic" may refer to acrylic and/or methacrylic.

Hereinafter, a transparent conductor according to one embodiment will be described with reference to FIG. 1. FIG. 1 illustrates a cross-sectional view of a transparent conductor according to one embodiment.

Referring to FIG. 1, a transparent conductor 100 according to one embodiment may include a transparent conductive layer 120 and a base layer 110.

The transparent conductive layer 120 may be formed on the base layer 110 and may include metal nanowires 121 and a matrix 122.

The metal nanowires 121 may be embedded in the matrix 122, may form a conductive network, and may help provide conductivity, flexibility, and/or bendability. The metal nanowires 121 may be partially exposed or may be completely embedded in the transparent conductive layer 120 to be prevented from being oxidized, thereby reducing sheet resistance of the transparent conductor, as shown in FIG. 1. In an implementation, the metal nanowires 121 may have an aspect ratio of about 10 to about 5,000, e.g., about 500 to about 1,000 or about 500 to about 700. Within this range of aspect ratio, the metal nanowires may help realize a highly conductive network even when distributed at low density. In an implementation, the metal nanowires 121 may have an average diameter of about 100 nm or less, e.g., about 10 nm to about 100 nm, about 10 nm to about 30 nm, or about 20 nm to about 30 nm, and a maximum length of about 20 μm or greater, e.g., about 20 μm to about 50 μm. Within these ranges of the diameter and maximum length, the metal nanowires may have high aspect ratio and thus may help increase conductivity of the transparent conductor and reduce sheet resistance of the transparent conductor. In an implementation, the metal nanowires 121 may be present in an amount of about 7 wt % or more, e.g., about 8 wt % to about 50 wt %, in the transparent conductive layer 120. Within this range, the metal nanowires may sufficiently form a conductive network, such that the transparent conductor may have high conductivity. The metal nanowires 121 may be formed of or include, e.g., silver, copper, aluminum, nickel, or gold. In an implementation, the metal nanowires may be formed of or include, e.g., silver.

A capping layer may be formed on surfaces of the metal nanowires 121. In an implementation, the capping layer may have a thickness of about 0.025 or less times the average diameter of the metal nanowires 121, e.g., about 0.005 times to about 0.025 times the average diameter of the metal nanowires 121. Within this range, the transparent conductor may have considerably low haze and transmissive b* without an undesirable increase in sheet resistance. In an implementation, the capping layer may have a thickness of about 1.0 nm or less, e.g., about 0.01 nm to about 0.7 nm. For example, when the metal nanowires have an average diameter of about 20 nm to about 30 nm, the capping layer may have a thickness of about 0.1 nm to about 0.7 nm. In an implementation, the capping layer may include at least one capping agent. In an implementation, the capping agent may include, e.g., polyvinylpyrrolidone, polyvinylalcohol, cetyltrimethylammonium bromide, cetyltrimethylammonium chloride, or polyacrylamide.

In an implementation, the capping layer may include a sulfur-containing compound or sulfur-containing moiety. The sulfur-containing compound or moiety may be bonded to at least a portion of surfaces of the metal nanowires 121 to help reduce contact resistance of the metal nanowires 121, thereby suppressing increase in sheet resistance. The sulfur-containing compound or moiety may be colorless and may help improve optical properties of the transparent conductor 100. For example, a sulfur-containing compound may be reacted with the metal nanowire to prepare a metal nanowire having a sulfur-containing compound or moiety thereon.

In an implementation, the sulfur-containing compound or moiety may include, e.g., a thiol group-containing compound or moiety, a sulfide group-containing compound or moiety, or a disulfide group-containing compound or moiety. The thiol group-containing compound or moiety may include, e.g., 2-aminoethanethiol (cysteamine), 1-propanethiol, 3-mercaptopropionic acid, (3-mercaptopropyl)trimethoxysilane, 1-butanethiol, 2-butanethiol, isobutylmercaptan, isoamylmercaptan, cyclopentanethiol, 1-hexanethiol, cyclohexanethiol, 6-hydroxy-1-hexanethiol, 6-amino-1-hexanethiol hydrochloric acid, 1-heptanethiol, 7-carboxy-1-heptanethiol, 7-amido-1-heptanethiol, 1-octanethiol, tert-octanethiol, 8-hydroxy-1-octanethiol, 8-amino-1-octanethiol hydrochloride, 1H,1H,2H,2H-perfluorooctanethiol, 1-nonanethiol, 1-decanethiol, 10-carboxy-1-decanethiol, 10-amido-1-decanethiol, 1-naphthalenethiol, 2-naphthalenethiol, 1-undecanethiol, 11-amino-1-undecanethiol hydrochloride, 11-hydroxy-1-undecanethiol, 1-dodecanethiol, 1-tetradecanethiol, 1-hexadecanethiol, 16-hydroxy-1-hexadecanethiol, 16-amino-1-hexadecanethiol hydrochloride, 1-octadecanethiol, 1,4-butanedithiol, 2,3-butanedithiol, 1,6-hexanedithiol, 1,2-benzenedithiol, 1,9-nonanedithiol, 1,10-decanedithiol, or 1,3,5-benzenetrithiol. The sulfide group-containing compound or moiety may include, e.g., propyl sulfide, furfuryl sulfide, hexyl sulfide, phenyl sulfide, phenyl trifluoromethyl sulfide, bis(4-hydroxyphenyl) sulfide, heptyl sulfide, octyl sulfide, nonyl sulfide, decyl sulfide, dodecylmethyl sulfide, dodecyl sulfide, tetradecyl sulfide, hexadecyl sulfide, or octadecyl sulfide. The disulfide group-containing compound or moiety may include, e.g., 2-hydroxyethyl disulfide, propyl disulfide, isopropyl disulfide, 3-carboxypropyl disulfide, allyl disulfide, isobutyl disulfide, tert-butyl disulfide, amyl disulfide, isoamyl disulfide, 5-carboxypentyl disulfide, furfuryl disulfide, hexyl disulfide, cyclohexyl disulfide, phenyl disulfide, 4-aminophenyl disulfide, heptyl disulfide, 7-carboxyheptyl disulfide, benzyl disulfide, tert-octyl disulfide, decyl disulfide, 10-carboxydecyl disulfide, or hexadecyl disulfide.

The matrix 122 may be formed on the base layer 110 and may help enhance bonding of the base layer 110 to the transparent conductive layer 120 and to prevent the metal nanowires 121 from being oxidized, thereby suppressing increase in sheet resistance of the transparent conductor 100 while improving chemical resistance, solvent resistance and durability (or, reliability) of the transparent conductor 100.

The matrix 122 may be formed of or from a matrix composition that includes a (meth)acrylic compound. The matrix 122 may be a urethane-based matrix containing a urethane group and may help increase curing density, thereby improving weatherability of the transparent conductive layer. In an implementation, the matrix composition may include a penta- or higher functional (meth)acrylic compound, a tri-functional (meth)acrylic compound, an initiator, and a solvent.

The penta- or higher functional (meth)acrylic compound as a component of the matrix 122 and may be a penta to deca-functional, e.g., a penta to hexa-functional (meth) acrylic compound, and may include a penta- or hexa-functional (meth)acrylic monomer and a penta- or hexa-functional (meth)acrylic oligomer. In an implementation, the oligomer may have at least two repeat units and may have a weight average molecular weight of about 10,000 g/mol or less, e.g., about 200 g/mol to about 5,000 g/mol or about 400 g/mol to about 3,000 g/mol. Within this range of weight average molecular weight, the oligomer may help improve adhesion between the base layer and electrode materials, optical properties, and chemical resistance, as a matrix of the transparent conductive layer. In an implementation, the penta- or hexa-functional (meth)acrylic monomer may be a penta- or hexa-functional (meth)acrylic monomer of $C_3$ to $C_{20}$ polyhydric alcohols and may include, e.g., dipentaerythritol penta(meth)acrylate, dipentaerythritol hexa(meth)acrylate, caprolactone-modified dipentaerythritol penta(meth) acrylate, or caprolactone-modified dipentaerythritol hexa (meth)acrylate. In an implementation, the penta- or hexa-functional (meth)acrylic oligomer may include, e.g., a penta- or hexa-functional urethane (meth)acrylate oligomer, a polyester (meth)acrylate oligomer, an epoxy (meth)acrylate oligomer, or a silicon-containing (meth)acrylate oligomer.

The tri-functional (meth)acrylic compound may be a component of the matrix and may help improve appearance of the matrix. In an implementation, the tri-functional (meth) acrylic monomer may include, e.g., a (meth)acrylic monomer of non-modified $C_3$ to $C_{20}$ polyhydric alcohols or a (meth)acrylic monomer of alkoxy-modified $C_3$ to $C_{20}$ polyhydric alcohols. In an implementation, the (meth)acrylic monomer of non-modified $C_3$ to $C_{20}$ polyhydric alcohols may include, e.g., trimethylolpropane tri(meth)acrylate, glycerol tri(meth)acrylate, pentaerythritol (meth)acrylate, or dipentaerythritol (meth)acrylate. The (meth)acrylic monomer of alkoxy-modified (for example, a C1 to C5 alkoxy group-modified, e.g., ethoxy group, propoxy group, or butoxy group-modified) $C_3$ to $C_{20}$ polyhydric alcohols may help further improve optical transmittance and reliability of the transparent conductor and/or may be more advantageous in terms of fine patterning than the (meth)acrylic monomer of a non-modified C3 to C20 polyhydric alcohol, and may include, e.g., ethoxylated trimethylolpropane tri(meth)acrylate or propoxylated glyceryl tri(meth)acrylate.

In an implementation, the penta- or higher functional (meth)acrylic compound may be present in an amount of about 10 wt % to about 70 wt %, e.g., about 10 wt % to about 60 wt %, in the matrix composition in terms of solid content. In an implementation, the tri-functional (meth)acrylic compound may be present in an amount of about 5 wt % to about 65 wt %, e.g., about 15 wt % to about 25 wt % or about 5 wt % to about 20 wt %, in the matrix composition in terms of solid content. Within these ranges, upon patterning of the transparent conductor, a highly uniform and fine pattern may be realized, thereby improving optical transmittance and reliability of the transparent conductor. As used herein, the term "solid content" refers to the content of solid components of the matrix composition, including, e.g., the penta- or higher functional (meth)acrylic compound, the tri-functional (meth)acrylic compound, and the initiator. In an implementation, a weight ratio of the penta- or higher functional (meth)acrylic compound to the tri-functional (meth)acrylic compound may range from about 1.5:1 to about 5:1, e.g., about 2:1 to about 4:1 to about 2.5:1 to about 3.5:1. Within this range, the matrix composition may exhibit increased curability.

The initiator may include suitable photo initiators, e.g., having an absorption wavelength of about 150 nm to about 500 nm. In an implementation, the initiator may include, e.g., a α-hydroxy ketone initiator or an α-amino ketone initiator. In an implementation, the initiator may include, e.g., 1-hydroxycyclohexyl phenyl ketone. In an implementation, the initiator may be present in an amount of about 1 wt % to about 25 wt %, e.g., about 10 wt % to about 25 wt %, in the matrix composition in terms of solid content. Within this range, the matrix composition may be completely cured, and it is possible to help prevent deterioration in optical properties of the transparent conductive layer by a residual initiator.

The solvent may help reduce viscosity of the matrix composition to provide coatability and to help improve appearance of the transparent conductive layer. In an implementation, the solvent may include, e.g., methylethyl ketone, methylisobutyl ketone, isopropyl alcohol, ethanol, or propylene glycol monomethyl ether acetate. In an implementation, the solvent may account for the balance of the matrix composition, e.g., 80 wt % or more. Within this range, the solvent can improve coatability of the matrix composition while enhancing appearance of the transparent conductive layer.

In an implementation, the matrix composition may further include at least one of an adhesion enhancer and an antioxidant. The adhesion enhancer may help enhance adhesion of the metal nanowires to the base layer while increasing reliability of the transparent conductor. In an implementation, the adhesion enhancer may include, e.g., a silane coupling agent or a mono- or bifunctional (meth)acrylic monomer. The silane coupling agent may include a suitable silane coupling agent. In an implementation, the silane coupling agent may include, e.g., an epoxy group-containing silane coupling agent such as 3-glycidoxypropyltrimethoxysilane, 3-glycidoxypropylmethyldimethoxysilane, and 2-(3,4-epoxycyclohexyl)ethyltrimethoxysilane; a polymerizable unsaturated group-containing silane coupling agent such as vinyltrimethoxysilane, vinyltriethoxysilane, and (meth)acryloxypropyltrimethoxysilane; or an amino group-containing silane coupling agent such as 3-aminopropyltrimethoxysilane, 3-aminopropyltriethoxysilane, N-(2-aminoethyl)-3-aminopropyltrimethoxysilane, and N-(2-aminoethyl)-3-aminopropylmethyldimethoxysilane. The mono- or bifunctional (meth)acrylic monomer may be a mono- or bifunctional (meth)acrylic monomer of a C3 to C20 polyhydric alcohol and may include at least one of isobornyl (meth)acrylate, cyclopentyl (meth)acrylate, cyclohexyl (meth)acrylate), trimethylolpropane di(meth)acrylate, ethylene glycol di(meth)acrylate, neopentylglycol di(meth) acrylate, hexanediol di(meth)acrylate, and cyclodecane dimethanol di(meth)acrylate. In an implementation, the adhesion enhancer may be present in an amount of about 0.1 parts by weight to about 1.0 part by weight based on 100 parts by weight of the penta- or higher functional (meth) acrylic compound, the tri-functional (meth)acrylic compound, the initiator, and the solvent. Within this range, the adhesion enhancer may help improve reliability and conductivity of the transparent conductor while enhancing adhesion of the metal nanowires to the base layer. The antioxidant may help prevent oxidation of the metal nanowire network. In an implementation, the antioxidant may include, e.g., triazole antioxidants, triazine antioxidants, phosphorus antioxidants such as phosphite antioxidants, hindered amine light stabilizer (HALS) antioxidants, phenol antioxidants, or metal acetylacetonate antioxidants. In an implementation, the phosphorus antioxidants may include, e.g., tris(2,4-di-tert-butylphenyl)phosphite, and the phenol antioxidants may include, e.g., pentaerythritoltetrakis(3-(3,5-di-tert-butyl-4-hydroxyphenyl)propionate. In an implementation, the HALS antioxidants may include, e.g., bis(2,2,6,6-tetramethyl-4-piperidyl)sebacate, bis(2,2,6,6-tetramethyl-4-piperidinyl)sebacate, bis(2,2,6,6-tetramethyl-5-piperidinyl)sebacate, a copolymer of dimethyl succinate and 4-hydroxy-2, 2,6,6-tetramethyl-1-piperidine ethanol, or 2,4-bis [N-butyl-n-(1-cyclohexyloxy-2,2,6,6-tetramethylpiperidine-4-yl) amino]-6-(2-hydroxyethylamine)-1,3,5-triazine. In an implementation, the metal acetylacetonate antioxidants may include tris(acetylacetonato)iron(III) or tris(acetylacetonato) chromium(III). In an implementation, the antioxidant may be present in an amount of about 0.1 parts by weight to about 5 parts by weight based on 100 parts by weight of the penta- or higher functional (meth)acrylic compound, the tri-functional (meth)acrylic compound, the initiator, and the solvent. Within this range, the antioxidant may help prevent oxidation of the metal nanowires, and, upon patterning of the transparent conductor, a highly uniform and fine pattern may be realized.

In an implementation, the matrix composition may further include an additive. The additive may include, e.g., an antistatic agent, a viscosity modifies, a heat stabilizer, a dispersant, a thickener, or the like. The matrix composition may have a viscosity of about 0.1 cP to about 20 cP at 25° C. Within this range, the additive may help improve coatability of the matrix composition and allow the composition to form a uniform thin film, such that the transparent conductive layer can exhibit uniform physical and chemical properties.

In an implementation, the transparent conductive layer 120 may have a thickness of about 10 nm to about 1 μm, e.g., about 10 nm to about 200 nm, about 20 nm to about 150 nm, or about 50 nm to about 130 nm. Within this range, the transparent conductor may be used as a film for a touch panel, and the transparent conductor may exhibit reduced contact resistance and improved etchability and optical properties.

The base layer 110 may be on the transparent conductive layer 120 and may help support the transparent conductive layer 120. In an implementation, the base layer 110 may include a resin film having a transmittance of about 85% to about 100%, e.g., about 90% to about 99%, as measured at a wavelength of 550 nm. Within this range of transmittance, the transparent conductor may have improved optical properties. In an implementation, the base layer may be a film formed of, e.g., polycarbonate, cyclic olefin polymer, polyester including polyethylene terephtalate, polyethylene naphtalate, and the like, polyolefin, polysulfone, polyimide, silicone, polystyrene, polyacrylic, or polyvinyl chloride resins. In an implementation, the base layer 110 may have a thickness of about 10 μm to about 200 μm, e.g., about 30 μm to about 150 μm or about 30 μm to about 50 μm. Within this range, the base layer may be effectively used in the transparent conductor. In FIG. 1, the base layer 110 of the transparent conductor is shown as having a monolayer structure. In an implementation, the transparent conductor may include a base layer having a multilayer structure. In an implementation, a functional layer may be stacked on one or both surfaces of the base layer 110. Examples of the functional layer may include a hard coating layer, an anti-corrosion layer, an anti-glare coating layer, an adhesion promoting layer, and an oligomer-release prevention layer.

In an implementation, the transparent conductor 100 may have a haze of about 1.1% or less, e.g., about 0.01% to about 1.1%, and a total luminous transmittance of about 90% to about 100%, e.g., about 90% to about 99%, as measured in the visible range (e.g., at a wavelength of about 400 nm to about 700 nm). Within this range, the transparent conductor may have high transparency and thus may be used as a transparent conductor. In an implementation, the transparent conductor 100 may have a transmissive b* of about 1.1 or less, e.g., about 0.7 to about 1.1. Within this range, it is possible to help prevent the transparent conductor from yellowing and to improve pattern visibility. In an implementation, the transparent conductor 100 may have a sheet resistance of about 100Ω/□ or less, e.g., about 10Ω/□ to about 100Ω/□ or about 10Ω/□ to about 50Ω/□, as measured using a 4-probe or a non-contact sheet resistance meter. Within this range, the transparent conductor may be effectively used as an electrode film for touch panels and can be applied to large area touch panels due to low sheet resistance. In an implementation, the transparent conductor 100 may have a thickness of about 10 μm to about 250 μm, e.g., about 50 μm to about 200 μm. Within this range, the transparent conductor may be effectively used as a transparent electrode film including a film for touch panels as well as a transparent electrode film for flexible touch panels. The transparent conductor 100 may take the form of a film and may be patterned through etching and the like to be used as a transparent electrode film for touch panels, E-paper, or solar cells.

Figure 2:
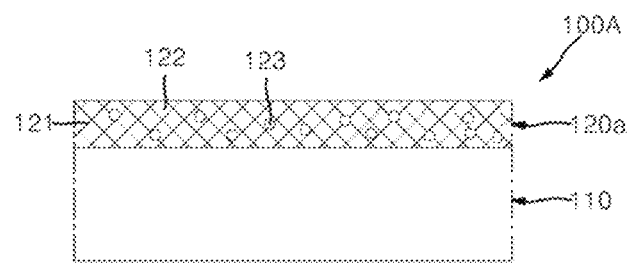
FIG. 2 illustrates a cross-sectional view of a transparent conductor according to another embodiment.

Next, a transparent conductor according to another embodiment will be described with reference to FIG. 2. FIG. 2 illustrates a sectional view of transparent conductor according to another embodiment.

Referring to FIG. 2, a transparent conductor 100A according to this embodiment is substantially the same as the transparent conductor 100 according to the above embodiment except that hollow particles 123 may be further included in a transparent conductive layer 120a. Thus, the following description will focus on the hollow particles 123.

The hollow particles 123 may be embedded in the transparent conductive layer 120a to help increase strength of the transparent conductive layer 120a while reducing the index of refraction of the transparent conductor 100A, thereby further reducing the haze and transmissive b* of the transparent conductor 100A. In an implementation, the hollow particles 123 may have an average particle diameter (D50) of about 20 nm to about 60 nm. Within this range, the hollow particles may be invisible when contained in the transparent conductive layer and may help reduce the haze of the transparent conductor. In an implementation, the hollow particles 123 may not be surface-treated or may be surface-treated with a fluorine resin to further reduce the index of refraction of the transparent conductive layer. In an implementation, the hollow particles 123 may include inorganic hollow particles, e.g., hollow silica particles. In an implementation, the hollow particles 123 may be present in an amount of about 0.001 wt % to about 20 wt % in the transparent conductive layer 120a. Within this range, the hollow particles may help increase the strength of the transparent conductive layer 120a while reducing the index of refraction of the transparent conductive layer 120a, thereby further reducing the haze of transparent conductor 100A. The hollow particles 123 may be included alone or in the form of a solution containing the hollow particles. The hollow particle-containing solution may include the hollow particles, a binder, an additive, and a solvent and may be present in an amount of about 0.1 parts by weight to about 20 parts by weight based on 100 parts by weight of the components of the matrix composition as set forth above, i.e. the penta- or higher functional (meth)acrylic compound, the tri-functional (meth)acrylic compound, the initiator, and the solvent.

Figure 3:
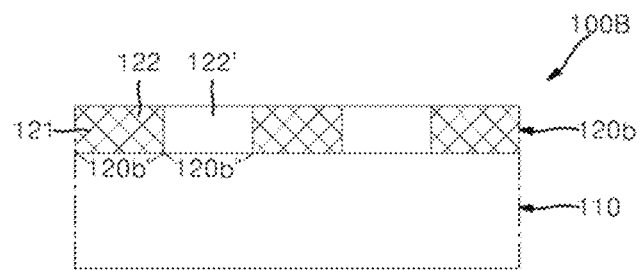
FIG. 3 illustrates a cross-sectional view of a transparent conductor according to a further embodiment.

Next, a transparent conductor according to a further embodiment will be described with reference to FIG. 3. FIG. 3 illustrates a cross-sectional view of a transparent conductor according to a further embodiment.

Referring to FIG. 3, a transparent conductor 100B according to this embodiment is substantially the same as the transparent conductor 100 according to the above embodiment except that a transparent conductive layer 120b may be patterned into a transparent non-conductive layer 120b" only including a transparent conductive layer 120b' and a matrix 122'. The transparent conductive layer 120b' may be the same as the transparent conductive layer 120 shown in FIG. 1, and the transparent non-conductive layer 120b" may include a matrix 122' not including a sulfur-containing compound or not including the metal nanowires. The transparent conductive layer 120b' may be formed by patterning the transparent conductive layer 120 according to the above embodiment through a suitable method.

Figure 4:
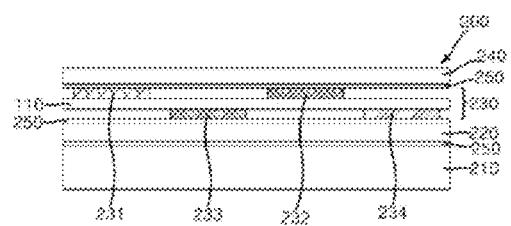
FIG. 4 illustrates a cross-sectional view of an optical display according to one embodiment.

Next, an optical display according to one embodiment will be described with reference to FIG. 4. FIG. 4 illustrates a cross-sectional view of an optical display according to one embodiment.

Referring to FIG. 4, an optical display 200 according to this embodiment may include a display unit 210, a polarizing plate 220, a transparent electrode module 230, a window film 240, and an adhesive layer 250, wherein the transparent electrode module 230 may be formed of any one of the transparent conductors according to the embodiments described above. In an implementation, in FIG. 4, the optical display may have a structure in which the display unit 210, the polarizing plate 220, the transparent electrode module 230, and the window film 240 are sequentially stacked one above another. In an implementation, the optical display may have a structure in which the display unit 210, the transparent electrode module 230, the polarizing plate 220, and the window film 240 are sequentially stacked one above another.

The display unit 210 may drive the optical display 200 and may include a substrate and an optical device including OLEDs, LEDs, or LCDs formed on the substrate. In one embodiment, the display unit 210 may include a lower substrate, a thin film transistor, an organic light emitting diode, a planarizing layer, a protective layer, and a dielectric layer. In another embodiment, the display unit 210 may include an upper substrate, a lower substrate, a liquid crystal layer disposed between the upper substrate and the lower substrate, and a color filter formed on at least one of the upper substrate and the lower substrate. In an implementation, the transparent electrode module 230 may be stacked as a separate layer above the display unit 210 as shown in FIG. 4. In an implementation, the transparent electrode module 230 may be formed inside the display unit.

The polarizing plate 220 may be formed on the display unit 210 to induce polarization of internal light or to prevent reflection of external light, thereby realizing a display or improving display contrast. In an implementation, the polarizing plate 220 may be composed only of a polarizer. In an implementation, the polarizing plate 220 may include a polarizer and a protective film formed on one or both surfaces of the polarizer. In an implementation, the polarizing plate may also be formed on an upper portion of the display unit 210 to further improve display contrast. Here, the polarizing plate may be formed on the display unit 210 through an adhesive layer.

The transparent electrode module 230 may be formed on the polarizing plate 220 to sense changes in capacitance that occur when the transparent electrode module 230 is touched by a finger or the like, thereby generating electrical signals. The transparent electrode module 230 may include a base layer 110, a first electrode 231 and a second electrode 232 formed on one surface of the base layer 110, and a third electrode 233 and a fourth electrode 234 formed on the other surface of the base layer 110. In an implementation, as shown in FIG. 4, the transparent electrode module may have a structure in which the third electrode 233 and the fourth electrode 234, the base layer 110, and the first electrode 231 and the second electrode 232 are sequentially stacked one above another. In an implementation, the transparent electrode module may have a structure in which the base layer 110, the third electrode 233 and the fourth electrode 234, the base layer 110, and the first electrode 231 and the second electrode 232 are sequentially stacked one above another.

The window film 240 may be formed at the outermost portion of the optical display 200 to protect the optical display 200. The window film 240 may be formed of a glass substrate or a flexible plastic substrate.

The adhesive layer 250 may be formed between the display unit 210 and the polarizing plate 220, between the polarizing plate 220 and the transparent electrode module 230, and between the transparent electrode module 230 and the window film 240 to enhance bonding between the display unit 210, the polarizing plate 220, the transparent electrode module 230, and the window film 240. The adhesive layer 250 may be formed of a suitable optically transparent adhesive.

Figure 5:
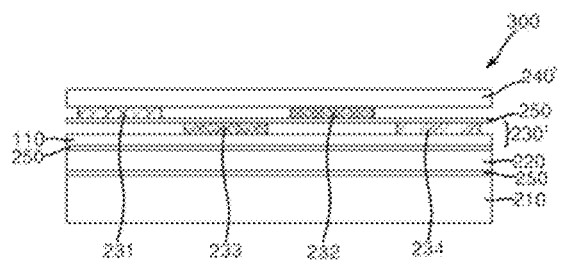
FIG. 5 illustrates a cross-sectional view of an optical display according to another embodiment.

Next, an optical display according to another embodiment will be described with reference to FIG. 5. FIG. 5 illustrates a cross-sectional view of an optical display according to another embodiment.

Referring to FIG. 5, an optical display 300 according to this embodiment is substantially the same as the optical display 200 according to the above embodiment except that a transparent electrode module 230' includes: a base layer 110; and a third electrode 233 and a fourth electrode 234 formed on one surface of the base layer 110, and the window film 240' has a first electrode 231 and a second electrode 232 formed thereon.

Next, a method of manufacturing a transparent conductor according to one embodiment will be described.

A method of manufacturing a transparent conductor according to one embodiment may include: forming a metal nanowire dispersion layer including metal nanowires having a capping layer formed on surfaces thereof on a base layer; coating a matrix composition onto the metal nanowire dispersion layer; and forming a transparent conductive layer by curing the metal nanowire dispersion layer and the matrix composition. The capping layer may include a sulfur-containing compound and may have a thickness of about 0.025 or less times, e.g., about 0.005 times to about 0.025 times, the average diameter of the metal nanowires.

The metal nanowire dispersion layer including metal nanowires having the capping layer formed on the surfaces thereof may be formed by coating a metal nanowire dispersion on the base layer, wherein the metal nanowire dispersion includes metal nanowires, a capping agent, a sulfur-containing compound, an acid having a pKa of about 4.0 to about 5.0 at 25° C., a binder, an initiator, and a solvent. The dispersion may further include an additive. The metal nanowires may be included in the form of a metal nanowire-containing solution including the metal nanowires, the binder, the initiator, and the like (for example, ClearOhm Ink G4-04 or G4-05 available from Cambrios Technologies Corp.), and the metal nanowire-containing solution may further include an additive. The binder may include at least one of a (meth)acrylate-based monofunctional monomer and a (meth)acrylate-based polyfunctional monomer. The binder, the initiator, and the additive may be present in an amount of about 0.1 parts by weight to about 50 parts by weight, e.g., about 1 part by weight to about 45 parts by weight based on 100 parts by weight of the metal nanowire dispersion. Within this range, the transparent conductor may have improved optical properties, an increase in contact resistance may be reduced and/or prevented, and durability and chemical resistance may be improved.

The acid having a pKa of about 4.0 to about 5.0 at 25° C. may help make the capping layer of the metal nanowires thinner to a thickness of about 0.025 times the average diameter of the metal nanowires, thereby reducing the haze of the transparent conductor without increase in sheet resistance while preventing deterioration in dispersibility of the metal nanowire dispersion when an excess of the sulfur-containing compound is used to reduce the haze and sheet resistance of the transparent conductor. In addition, in combination with the sulfur-containing compound, the acid having a pKa of about 4.0 to about 5.0 at 25° C. may help improve dispersibility of the metal nanowire dispersion, reduce the haze and sheet resistance of the transparent conductor, and enhance appearance of the transparent conductive layer. In an implementation, the acid having a pKa of about 4.0 to about 5.0 at 25° C. may include organic acids, e.g., acetic acid, ascorbic acid, benzoic acid, oxalic acid, and propionic acid. In an implementation, the acid having a pKa of about 4.0 to about 5.0 at 25° C. may be present in an amount of about 0.0001 parts by weight to about 5 parts by weight, e.g., about 0.001 parts by weight to about 0.1 parts by weight or about 0.001 parts by weight to about 0.01 parts by weight based on 100 parts by weight of the metal nanowire dispersion in terms of 100% pure solution. Within this range, the acid may help prevent oxidation of the metal nanowires, improve dispersibility of the metal nanowire dispersion, reduce the haze and sheet resistance of the transparent conductor, and enhance appearance of the transparent conductive layer. In an implementation, the sulfur-containing compound may be present in an amount of about 0.0001 parts by weight to about 5 parts by weight, e.g., about 0.0001 parts by weight to about 0.1 parts by weight or about 0.0001 parts by weight to about 0.01 parts by weight based on 100 parts by weight of the metal nanowire dispersion. Within this range, the sulfur-containing compound may help reduce the haze and sheet resistance of the transparent conductor while providing reduction in pattern visibility. In an implementation, the solvent may include an organic solvent. In an implementation, the solvent may include, e.g., water including ultra-pure water and/or alcohols.

In an implementation, the coating may be performed by bar coating, slot die coating, gravure coating, or roll-to-roll coating. Coating thickness may range from about 10 nm to about 1 μm, e.g., about 20 nm to about 150 nm or about 50 nm to about 130 nm. Curing may facilitate formation of the transparent conductive layer while improving strength of the transparent conductive layer. Curing may be performed by at least one of thermal curing and photocuring. Thermal curing may be performed at, e.g., about 40° C. to about 180° C. for a period of time of about 1 minute to about 48 hours. Photocuring may be performed through, e.g., UV irradiation at a fluence of about 50 mJ/cm$^2$ to about 1,000 mJ/cm$^2$. The layer of the metal nanowire dispersion may be dried prior to curing of the metal nanowire dispersion, thereby reducing curing time. Here, drying may be performed at, e.g., about 40° C. to about 180° C. for a period of time of about 1 minute to about 48 hours.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

(A) Penta- or higher functional (meth)acrylic compound: A hexa-functional urethane acrylate oligomer (Ebecryl 9390, Entis Tech Co., Ltd., weight average molecular weight; 1,000 g/mol)

(B) Tri-functional (meth)acrylic compound: Propoxylated glyceryl triacrylate (SR9020, Sartomer Inc.)

(C) Initiator: Irgacure 184 (CIBA Specialty Chemicals)

(D) Adhesion enhancer: 3-amino propyltriethoxysilane (KBE-903, Shin-Etsu Chemical Co., Ltd.)

(E) Antioxidant: A mixture of a phenol antioxidant, Irganox 1010 and a phosphorus antioxidant, Irgafos 168 (BASF Chemical)

(F) Hollow particle-containing solution: Hollow silica-containing sol (A-2505LR, Pelnox, Ltd., amount of hollow silica: 6 wt %, total amount of silica, a binder, and an additive: 10 wt %, average particle diameter (D50): 20 nm to 30 nm)

PREPARATIVE EXAMPLE 1

Preparation of Matrix Composition 1.35 parts by weight of a hexa-functional urethane acrylate oligomer, 0.45 parts by weight of a propoxylated glyceryl triacrylate, 0.5 parts by weight of an initiator, 97.7 parts by weight of methylisobutyl ketone were mixed, thereby preparing 100 parts by weight of a mixture. To the mixture, 0.5 parts by weight of an adhesion enhancer and 1 part by weight of an antioxidant were added, thereby preparing a matrix composition (having a viscosity of 0.56 cP at 25° C.).

PREPARATIVE EXAMPLE 2

Preparation of Matrix Composition 1.35 parts by weight of a hexa-functional urethane acrylate oligomer, 0.45 parts by weight of a propoxylated glyceryl triacrylate, 12 parts by weight of hollow silica-containing sol, 85.7 parts by weight of methylisobutyl ketone, and 0.5 parts by weight of an initiator were mixed, thereby preparing 100 parts by weight of a mixture. To the mixture, 0.5 parts by weight of an adhesion enhancer and 1 part by weight of an antioxidant were added, thereby preparing a matrix composition (having a viscosity of 0.56 cP at 25° C.).

EXAMPLE 1

36.5 parts by weight of a silver nanowire-containing solution (ClearOhm ink, Cambrios Technologies Corp., total amount of silver nanowires and a binder: 2.45 wt %, average diameter of silver nanowires: about 25 nm) was mixed with 63.4969 parts by weight of ultra-pure water. To the mixture, 0.003 parts by weight of acetic acid (100% pure solution, Samchun Pure Chemical Co., Ltd.) and 0.0001 parts by weight of a thiol group-compound, cysteamine (TCI), were added, followed by stirring, thereby preparing 100 parts by weight of a silver nanowire dispersion.

10 parts by weight of 100 parts by weight of the prepared silver nanowire dispersion was deposited on a base layer (polycarbonate film, WRS-148, thickness: 50 μm) by spin coating, thereby forming a layer of the silver nanowire dispersion. The layer of the silver nanowire dispersion was dried in an oven at 80° C. for 120 seconds, thereafter by spin coating 10 parts by weight of the matrix composition of Preparative Example 1 thereon and drying at an oven at 80° C. for 120 seconds and at 140° C. for 120 seconds, followed by curing through UV irradiation at a fluence of 500 mJ/cm$^2$, thereby manufacturing a transparent conductor. Here, a capping layer having a thickness shown in Table 1 and including polyvinylpyrrolidone and cysteamine was formed on surfaces of the silver nanowires.

EXAMPLES 2 to 6 and COMPARATIVE EXAMPLES 1 to 4

A transparent conductor was manufactured in the same manner as in Example 1 except that the amount of each of acetic acid and cysteamine was changed as listed in Tables 1 and 2 to prepare 100 parts by weight of a silver nanowire dispersion and the kind of a matrix composition was changed as listed in Tables 1 and 2.

Figure 6A:
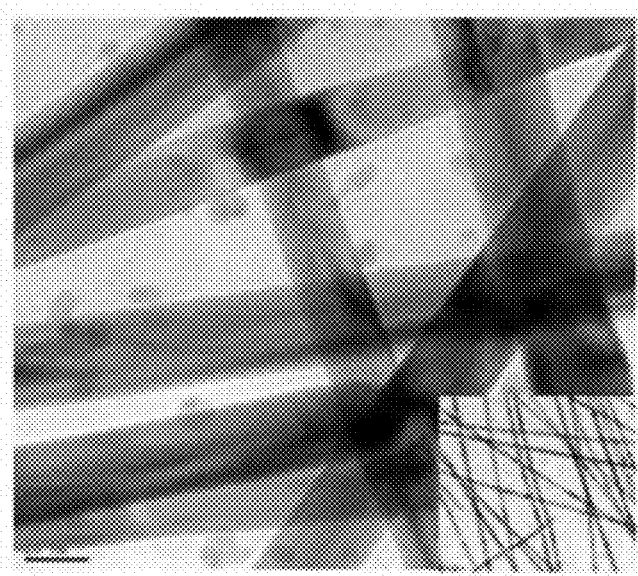
FIG. 6A illustrates a TEM image of a transparent conductive layer of Example 5 and FIG. 6B illustrates a TEM image (magnification: 590 k) of silver nanowires of the transparent conductive layer of Example 5.
Figure 6B:
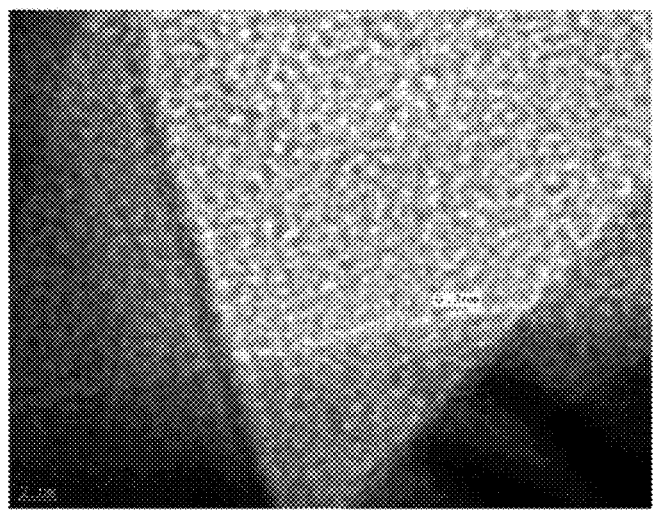
Figure 7A:
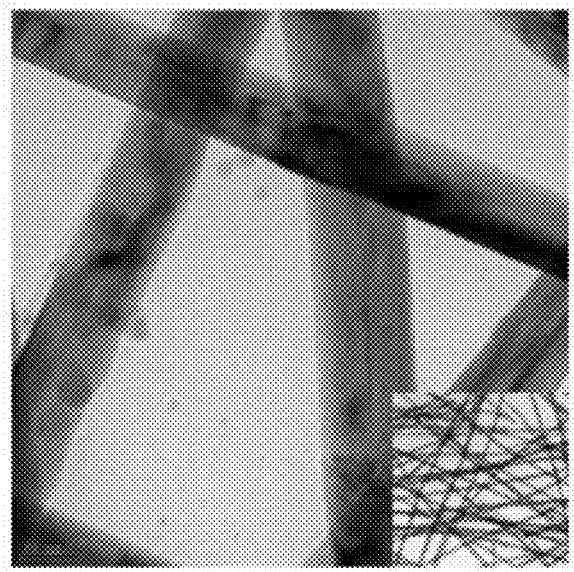
FIG. 7A illustrates a TEM image of a transparent conductive layer of Comparative Example 1 and FIG. 7B illustrates a TEM image (magnification: 590 k) of silver nanowires of the transparent conductive layer of Comparative Example 1.
Figure 7B:
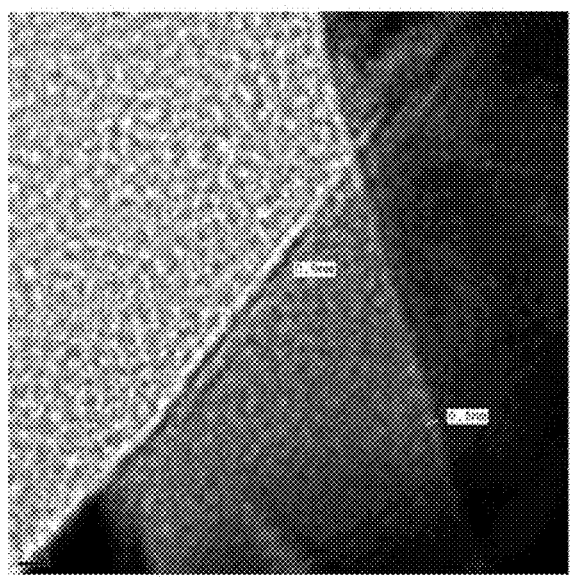

The transparent conductors manufactured in Examples and Comparative Examples were evaluated as to the following properties. Results are shown in Table 1. Transmission electron microscopy (TEM) images of cross-sections of the transparent conductive layers manufactured in Example 5 and Comparative Example 1 are shown in FIG. 6 and FIG. 7, respectively.

(1) Haze and total luminous transmittance: Each of the transparent conductors was placed such that the transparent conductive layer faced a light source. Haze and total luminous transmittance were measured at a wavelength of 400 nm to 700 nm using a haze meter (NDH-9000, NIPPON DENSHOKU).

(2) Transmissive b*: Transmissive b* of each of the transparent conductors was measured at a wavelength of 300 nm to 1,000 nm (optimal wavelength: 400 nm to 700 nm) using a Konica Minolta CIE Lab colorimeter (CM-3600A).

(3) Thickness of capping layer: Thickness of the capping layer was measured by observing a TEM image of each of the transparent conductors.

TABLE 1

|  | Example 1 | Example 2 | Example 3 | Example 4 | Example 5 | Example 6 |
| --- | --- | --- | --- | --- | --- | --- |
| Acetic acid (parts by weight) | 0.003 | 0.003 | 0.003 | 0.003 | 0.003 | 0.003 |
| Cysteamine (parts by weight) | 0.0001 | 0.001 | 0.01 | 0.0001 | 0.001 | 0.01 |
| Matrix composition | Preparative Example 1 | Preparative Example 1 | Preparative Example 1 | Preparative Example 2 | Preparative Example 2 | Preparative Example 2 |
| Haze (%) | 1.02 | 1.02 | 1.04 | 1.00 | 0.93 | 0.97 |
| Total luminous transmittance (%) | 90.79 | 90.87 | 90.82 | 91.09 | 91.10 | 91.12 |
| Transmissive b* | 0.99 | 1.03 | 1.05 | 0.97 | 0.80 | 0.87 |
| Thickness of capping layer (nm) | 0.5~0.6 | 0.2~0.3 | 0.4~0.5 | 0.5~0.6 | 0.2~0.3 | 0.4~0.5 |
| T* | 0.02~0.024 | 0.008~0.012 | 0.016~0.02 | 0.02~0.024 | 0.008~0.012 | 0.016~0.02 |

TABLE 2

|  | Comparative Example 1 | Comparative Example 2 | Comparative Example 3 | Comparative Example 4 |
| --- | --- | --- | --- | --- |
| Acetic acid (parts by weight) | 0 | 0.003 | 0.01 | 0.015 |
| Cysteamine (parts by weight) | 0 | 0 | 0 | 0 |
| Matrix composition | Preparative Example 1 | Preparative Example 1 | Preparative Example 1 | Preparative Example 1 |
| Haze (%) | 1.30 | 1.18 | 1.23 | 1.25 |
| Total luminous transmittance (%) | 90.98 | 90.91 | 90.83 | 90.94 |
| Transmissive b* | 1.52 | 1.43 | 1.35 | 1.24 |
| Thickness of capping layer (nm) | 0.8~0.9 | 0.7~0.8 | 0.8~0.9 | 0.7~0.8 |
| T* | 0.032~0.036 | 0.028~0.032 | 0.032~0.036 | 0.028~0.032 |

*T denotes a ratio of thickness of the capping layer to average diameter of the silver nanowires As shown in Table 1, it may be seen that the transparent conductors according to Examples 1-6 exhibited low haze. Conversely, as shown in Table 2, it may be seen that the transparent conductors of Comparative Examples 2 to 4, which included the acid having a pKa of about 4 to about 5 at 25° C. alone, exhibited higher haze than those of Examples 1 to 3.

As shown in FIG. 6 and FIG. 7, it may be seen that the transparent conductor of Example 5, produced using both acetic acid and cysteamine included a capping layer having a small thickness of 0.2 nm to 0.3 nm, whereas the transparent conductor of Comparative Example 1 manufactured using neither acetic acid nor cysteamine included a capping layer having a thickness of 0.8 nm to 0.9 nm (thicker than those of the Examples).

By way of summation and review, metal nanowires may include a capping layer. When the metal nanowires are embedded in a matrix, the transparent conductor may have high haze. In addition, the metal nanowires may scatter light, and the transparent conductor can have high haze. Further, the capping layer may be non-conductive and thus could increase the sheet resistance of the transparent conductor.

According to an embodiment, it is possible to provide a transparent conductor that has low sheet resistance and haze and exhibits improved pattern visibility. In addition, according to an embodiment, it is possible to provide a transparent conductor that has low haze and transmissive b* without increase in sheet resistance. Further, according to an embodiment, it is possible to provide a method of manufacturing the transparent conductor as set forth above and a display including the transparent conductor as set forth above.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A transparent conductor, comprising:
   metal nanowires; and
   a matrix in which the metal nanowires are embedded, wherein:
      a capping layer is formed on surfaces of the metal nanowires, the capping layer including a sulfur-containing compound, and
      the capping layer has a thickness of about 0.025 or less times an average diameter of the metal nanowires.

2. The transparent conductor as claimed in claim 1, wherein the capping layer has a thickness of about 0.005 times to about 0.025 times the average diameter of the metal nanowires.

3. The transparent conductor as claimed in claim 1, wherein the transparent conductor has a haze of about 1.1% or less, as measured in the visible range.

4. The transparent conductor as claimed in claim 1, wherein the transparent conductor has a transmissive b* of about 1.1 or less, as measured at a wavelength of 400 nm to 700 nm.

5. The transparent conductor as claimed in claim 1, wherein the metal nanowires are silver nanowires.

6. The transparent conductor as claimed in claim 1, wherein the capping layer includes polyvinylpyrrolidone, polyvinylalcohol, cetyltrimethylammonium bromide, cetyltrimethylammonium chloride, or polyacrylamide.

7. The transparent conductor as claimed in claim 1, wherein the sulfur-containing compound includes a thiol group-containing compound.

8. The transparent conductor as claimed in claim 7, wherein the thiol group-containing compound includes 2-aminoethanethiol, 1-propanethiol, 3-mercaptopropionic acid, (3-mercaptopropyl)trimethoxysilane, 1-butanethiol, 2-butanethiol, isobutylmercaptan, isoamylmercaptan, cyclopentanethiol, 1-hexanethiol, cyclohexanethiol, 6-hydroxy-1-hexanethiol, 6-amino-1-hexanethiol hydrochloric acid, 1-heptanethiol, 7-carboxy-1-heptanethiol, 7-amido-1-heptanethiol, 1-octanethiol, tert-octanethiol, 8-hydroxy-1-octanethiol, 8-amino-1-octanethiol hydrochloride, 1H,1H,2H,2H-perfluorooctanethiol, 1-nonanethiol, 1-decanethiol, 10-carboxy-1-decanethiol, 10-amido-1-decanethiol, 1-naphthalenethiol, 2-naphthalenethiol, 1-undecanethiol, 11-amino-1-undecanethiol hydrochloride, 11-hydroxy-1-undecanethiol, 1-dodecanethiol, 1-tetradecanethiol, 1-hexadecanethiol, 16-hydroxy-1-hexadecanethiol, 16-amino-1-hexadecanethiol hydrochloride, 1-octadecanethiol, 1,4-butanedithiol, 2,3-butanedithiol, 1,6-hexanedithiol, 1,2-benzenedithiol, 1,9-nonanedithiol, 1,10-decanedithiol, or 1,3,5-benzenetrithiol.

9. The transparent conductor as claimed in claim 1, wherein:
   the metal nanowires are silver nanowires,
   the capping layer includes polyvinylpyrrolidone, and
   the sulfur-containing compound is a thiol group-containing compound.

10. The transparent conductor as claimed in claim 9, wherein the matrix further includes hollow silica.

11. A method of manufacturing the transparent conductor as claimed in claim 1, the method comprising:
   forming a metal nanowire dispersion layer on a base layer, the metal nanowire dispersion including the metal nanowires with the capping layer formed on surfaces of the metal nanowires;
   coating a matrix composition onto the metal nanowire dispersion layer; and
   forming a conductive layer by curing the metal nanowire dispersion layer and the matrix composition,
   wherein the capping layer includes the sulfur-containing compound.

12. The method as claimed in claim 11, wherein the metal nanowires with the capping layer formed on surfaces thereof are prepared from a metal nanowire dispersion including the metal nanowires, a capping agent, the sulfur-containing compound, and an acid having a pKa of about 4.0 to about 5.0 at 25° C.

13. The method as claimed in claim 12, wherein the acid includes acetic acid.

14. A display comprising the transparent conductor as claimed in claim 1.

15. A display comprising a transparent conductor manufactured by the method of manufacturing a transparent conductor as claimed in claim 11.

16. The transparent conductor as claimed in claim 7, wherein the thiol group-containing compound includes 2-aminoethanethiol, 3-mercaptopropionic acid, (3-mercaptopropyl)trimethoxysilane, 6-hydroxy-1-hexanethiol, 6-amino-1-hexanethiol hydrochloric acid, 7-carboxy-1-heptanethiol, 7-amido-1-heptanethiol, 8-hydroxy-1-octanethiol, 8-amino-1-octanethiol hydrochloride, 1H,1H,2H,2H-perfluorooctanethiol, 10-carboxy-1-decanethiol, 10-amido-1-decanethiol, 1-naphthalenethiol, 2-naphthalenethiol, 11-amino-1-undecanethiol hydrochloride, 11-hydroxy-1-undecanethiol, 16-hydroxy-1-hexadecanethiol, 16-amino-1- hexadecanethiol hydrochloride, 1,4-butanedithiol, 2,3-butanedithiol, 1,6-hexanedithiol, 1,2-benzenedithiol, 1,9-nonanedithiol, 1,10-decanedithiol, or 1,3,5-benzenetrithiol.

* * * * *